United States Patent [19]

Clénet

[11] 4,446,513

[45] May 1, 1984

[54] DC/AC BRIDGE INVERTER INCLUDING A SWITCHING AID AND INDUCTIVE ENERGY RECOVERY CIRCUIT

[75] Inventor: Daniel Clénet, Grasse, France

[73] Assignee: La Telemecanique Electrique, France

[21] Appl. No.: 359,712

[22] PCT Filed: Jun. 12, 1981

[86] PCT No.: PCT/FR81/00074

§ 371 Date: Feb. 9, 1982

§ 102(e) Date: Feb. 9, 1982

[87] PCT Pub. No.: WO81/03722

PCT Pub. Date: Dec. 24, 1981

[30] Foreign Application Priority Data

Jun. 13, 1980 [FR] France .................. 80 13146

[51] Int. Cl.³ .................. H02M 7/537; H02M 7/515
[52] U.S. Cl. .................. 363/132; 363/138
[58] Field of Search ............ 363/96, 98, 132, 136–138; 318/801–803

[56] References Cited

U.S. PATENT DOCUMENTS 3,460,021  8/1969  Schlabach ............... 363/138
3,474,322 10/1969  King ...................... 363/136
4,019,117  4/1977  Gehm et al. ............. 363/138
4,072,882  2/1978  Wiart ..................... 363/138

Primary Examiner—William H. Beha, Jr.
Attorney, Agent, or Firm—William A. Drucker

[57] ABSTRACT

A DC/AC converter consisting of bridge-connected transistors or thyristors and bridge-connected recovery diodes, wherein the center points of the diode bridge are connected with the corresponding center points of the transistor or thyristor bridge, including a switching aid inductor ($L_1$, $L_2$, 17, 18) in each half-bridge, to which is connected one terminal of a storage capacitor ($C_1$, $C_3$, 21, 22) the other terminal of which is connected to the input of a respective energy recovery circuit ($RE_1$, $RE_2$, 23, 24) the outputs of which are connected to the supply terminals of the DC/AC converter.

4 Claims, 5 Drawing Figures

DC/AC BRIDGE INVERTER INCLUDING A SWITCHING AID AND INDUCTIVE ENERGY RECOVERY CIRCUIT

BACKGROUND OF THE INVENTION

The invention relates to a DC/AC converter consisting of controlled valves which are connected in a bridge and including recovery diodes also connected in a bridge, the device being of the type wherein the center points of the recovery diode bridge are connected to the corresponding center points of the valve bridge.

OBJECT OF THE INVENTION

The object of the invention is to improve the DC/AC converter of the above-said type.

In accordance with the invention, such a device is characterized in that it includes a switching aid and energy recovery circuit which is connected across the transistor or thyristor DC/AC converter.

THE PRIOR ART

Operation of power transistors with an inductive load, i.e. with the load type which is most frequently found in circuits where transistors play a switching role subjects same to stresses having adverse effects on the circuit efficiency and the transistor lifetime.

Specifically, the transistor is subjected to switching losses upon firing and blocking. Switching losses upon firing are associated with occurence of an overcurrent, while switching losses upon blocking are associated with simultaneous application of the overall voltage across the transistor while the load current is still flowing through the transistor.

It is known to reduce the firing overcurrent by inserting a switching aid inductor connected in series with the load into a circuit consisting of a diode in series with a resistor and connected in parallel with said inductor, whereby the diode is connected so as to be directly biased whenever the transistor is blocked. A drawback of such a circuit arrangement is that upon transistor blocking the energy stored in the switching aid inductor becomes dissipated in the resistor.

It is also known to reduce the blocking stress by arranging, in parallel with the transistor, a circuit consisting of a capacitor having a relatively low capacitance and an additional series-connected diode. An additional resistor is preferably connected in parallel either with said additional diode or with both diodes. Said additional diode is connected so as to be directly biased whenever the transistor becomes blocked. A drawback of such an arrangement is that upon transistor firing the energy stored in the capacitor becomes dissipated in said additional resistor.

Thus, known transistor switching aid circuits, although reducing transistor proper switching losses, undesirably generate losses through energy dissipation in the resistors included therein. These losses may become sufficiently high to destroy the transistor whenever the switching rate and/or the supply voltage exceed certain levels.

SUMMARY OF THE INVENTION

The present invention provides a DC/AC converter including a switching aid and energy recovery circuit wherein said dissipation losses are either reduced or removed.

The device in accordance with the invention includes first series circuit connected at each of the DC inputs of a thyristor valve bridge and consisting of a transistor and an inductor, the other terminal of said first series circuit being connected to the respective supply terminal; a second series circuit associated with each first series circuit and connected in parallel between the connecting point of the inductor and the transistor of each first series circuit and the respective supply terminal, said second series circuit comprising a series-connection of a storage capacitor and a diode the anode of which is connected to the connecting point of the inductor and the transistor and the cathode of which is connected to the storage capacitor and to the respective end of the diode-bridge; a low voltage-high voltage converter circuit the inputs of which are connected to the terminals of the storage capacitor and the outputs of which are connected to the terminals of the supply network; a switching aid capacitor which is associated with each first circuit and one terminal of which is connected to the connecting point of the transistor and the respective input of the thyristor bridge.

In such a circuit arrangement, the switching aid capacitor first forms with the inductor an oscillating circuit upon firing of the transistor and, in a second step, the current which was flowing through the inductance charges the storage capacitor, to which energy is thus fed back. Likewise, upon transistor blocking, the current which was flowing through the switching aid capacitor charges the storage capacitor through the switching aid inductor.

In accordance with a particular feature of the invention, the energy thus stored in the storage capacitor is fed back to the power source by means of a low voltage-high voltage converter circuit.

BRIEF DESCRIPTION OF THE DRAWINGS

Other features and the advantages of the invention will become apparent from the following disclosure thereof.

In the accompanying drawings

DESCRIPTION OF THE PREFERRED EMBODIMENT

Figure 1:
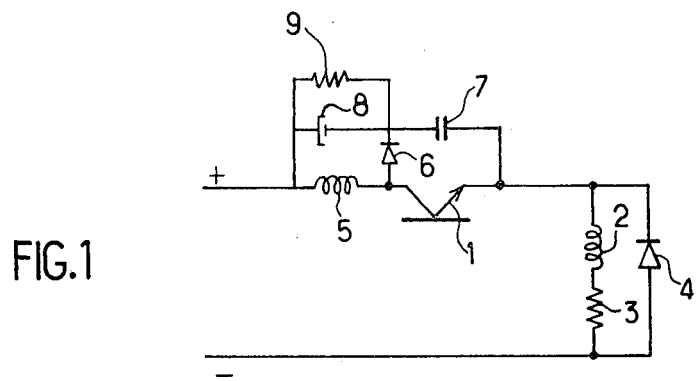
FIGS. 1 and 2 are flow diagrams of a switching aid and energy recovery device in accordance with the state of the art.

The circuit as shown in FIG. 1 includes a power transistor 1, or several parallel connected such transistors, for feeding an inductive load with which it is series-connected and which operates in a switching mode. The load comprises an inductive component 2, a resistive component 3 and may also comprise an electromotive force. A recovery diode 4 is, in a manner known per se, connected in parallel with the load so as to be reversely biased whenever the transistor is conducting. The load can equally be connected either to the transistor emitter (as shown in FIG. 1) or collector.

Whenever the transistor is fired through application of a control voltage to its base by not shown means, the current provided by the source flows through the load-transistor assembly and back to the source. Whenever the transistor is blocked (by the same means), the current provided by the source is abruptly cut off and the current flowing through the inductive component 2 closes itself through diode 4.

The above firing-blocking phenomenon repeats itself at a rate f controlled by the control means and results in so-called switching losses (conduction losses through the transistor are comparatively negligible) which may become sufficiently high to damage the transistor.

The switching losses upon firing of the transistor are associated with occurrence of an overcurrent during the period of recovery of the electric charges stored in the junction of the recovery diode. It is known to reduce this overcurrent by inserting in series-connection with the load a low-valve switching aid inductor with which is parallel-connected a circuit path comprising a diode series-connected with a resistor, whereby the diode is connected so as to be directly biased whenever the transistor is blocked.

The switching losses upon blocking of the transistor are associated with an increase of the collector-emitter voltage while the load inductive component tends to maintain constant the current through the transistor. It is known to reduce this voltage by arranging in parallel-connection with the transistor a circuit parth consisting of series-connected capacitor and diode. Preferably, a resistor is parallel connected with the diode, which is connected so as to be conducting whenever the transistor becomes blocked.

With such switching aid circuits, the losses through the transistor are highly decreased. On the other hand, losses occur through the resistors associated with the switching aid inductor and capacitor. These losses are:

For the inductance: $P_L = \frac{1}{2} L \cdot I^2 \times f$

For the capacitor: $P_c = \frac{1}{2} C \cdot V^2 \times f$

A limitation to the increase in the power P=VI available at the load terminals and to the operating frequency increase is thus apparent. Indeed, losses $P_c$ and $P_L$ become early high and result both in dissipation problems and efficiency decrease.

With the device as described hereinbelow the number of components used for the switching aid circuits can be reduced and more particularly a recovery of losses is possible. In this way, the losses are minimal and consequently the capacity and operating frequency of the device can be highly increased, and the efficiency is substantially improved.

In the switching aid circuits as shown in FIG. 1, inductor 5 is connected at one end to one terminal of transistor 1, which terminal may equally be the transistor collector or emitter. To this connecting point is connected one terminal of diode 6.

The other terminal of diode 6 is connected to one terminal of switching aid capacitor 7 and to one terminal of a storage capacitor 8 the capacitance of which is much higher than the capacitance of switching aid capacitor. The storage capacitor may be, e.g. a low voltage electrochemical capacitor having a capacitance such that its charge remains substantially constant while the circuit is operating. As an example, if the switching aid capacitor has a capacitance of 1 F, capacitor 8 may have a capacitance of 1000 F. The other terminal of the switching aid capacitor is connected to the other terminal of the transistor, and the other terminal of the storage capacitor is connected to the available terminal of the switching aid inductor.

Diode 6 is so connected that the circuit path consisting of said diode and of the storage capacitor is reversely biased whenever the transistor is conducting.

It should be apparent that the just-described switching aid device distinguishes from known devices in that the diode and resistor associated with the switching aid inductor are replaced with a storage capacitor. It operates as follows. When the transistor is fired, the circuit path consisting of the switching aid capacitor series-connected with the storage capacitor is put into parallel-connection with the switching aid inductor through the transistor. The series-connection of capacitors 7 and 8 is equivalent to capacitor 7 which has the lower capacitance. Thus, capacitor 7 and inductor 8 form an oscillating circuit. The current originating from the oscillating circuit is of sine wave pattern. Upon firing of the transistor, the level of this current is zero; it is maximum at the time instant corresponding to a quarter of the oscillating circuit period. At the same time, the capacitor voltage is zero. It is the same of the voltage across the inductor. At the next time instant, the voltage across the inductor tends to reverse itself resulting in diode closure. The current which was flowing through the inductor then begins to charge the storage capacitor.

Whenever the transistor becomes blocked, the current which was flowing therethrough is derived through the diode to the switching aid capacitor and, once the collector-emitter voltage has reached the source voltage, the current which was flowing through the inductor begins again to charge the storage capacitor.

Thus, by means of the above circuit, the energy from the switching aid capacitor can be transferred to the switching aid inductor, and is subsequently transferred into the storage capacitor. It is the same of the energy stored in the switching aid inductor, which energy results from the current through the load.

Therefore, the energies:

$$\tfrac{1}{2} L\, I^2 \text{ and } \tfrac{1}{2} C\, V_A^2$$

(wherein I is the current through the load, $V_A$ is the supply voltage, L and C are the values of the switching aid inductor and capacitor, respectively) are stored in voltage form in the storage capacitor. Voltage $V_r^2$ across the latter will thus be such that:

$$V_r^2 = 1/C_r (LI^2 + CV_A^2)$$

(wherein $C_r$ is the capacitance of the storage capacitor).

Depending upon the amount of energy thus stored, it will be possible either to dissipate it through a resistor 9 parallel-connected with the storage capacitor or to recover the latter for feeding it back to the source. For this latter purpose, resistor 9 will be replaced, e.g. by a voltage step-up transformer operating at high frequency or by a circuit path comprising a high-voltage transistor and an inductor. Such circuits for feeding back energy to the source are wellknown per se, and a circuit of this kind is shown as a block (10) in FIG. 2.

The just-described circuit provides, in addition to its capability of energy recovery, the following advantages:

The voltage across the load equals the difference between the supply voltage (which is a constant DC voltage) and the voltage across the inductor 5. Since the latter voltage is in the form of an arch of a sine curve, upon firing of the transistor the voltage across the load will also have a sine wave form, i.e.:

$$V = V_A \sin \omega t$$

The maximum value of the derivative of the voltage across the load is thus:

$$d_v/d_t \max = \omega V_A$$

wherein $$\omega = 1/\sqrt{LC}$$

For this reason, the maximum value of the derivative can be limited without adding any component. Such a feature allows to limit the current peak through the recovery diode parallel-connected with the load. In some applications where the load will be another transistor (case of a bridge circuit as in FIG. 4), the current peak will also be reduced through said load transistor.

In some other applications as set forth herein after (FIG. 5), the load will consist of a thyristor. Then, chances of any undesired firing by dV/dt will be reduced.

If the storage capacitor 8 is associated with an auxiliary circuit which maintains constant the voltage across its terminals, which auxiliary circuit may be the recovery circuit itself, then transistor 1 bears only the supply voltage plus the voltage of the storage capacitor, whichever is the level of the current which was flowing through the switching aid inductor. In the prior art circuit, where said inductor was connected across a diode-resistor circuit, the voltage applied to the transistor was equal to the supply voltage plus the intensity of the current flowing through the inductor times the resistance of the switching aid resistor, which might cause an objectionable overvoltage.

It should be noted that operation of the circuit results in pre-charging the switching aid capacitor.

Indeed, after the firing stage, once transistor 1 has been saturated, the switching aid capacitor becomes charged up to the voltage of the storage capacitor. Thus, transistor blocking is carried out under a pre-existing voltage, whereby the decay time of the collector current can be substantially reduced.

With the arrangement including the above-described switching aid circuit, the stresses on the transistor can eventually be reduced by providing a capability of perfectly controlling the switching process. The transistor is never subjected to simultaneous voltage and current. With such a circuit, substantially all the losses which are usually dissipated in other circuit arrangements can be recovered, and value of dV/dt which is applied to the load can be limited, which is highly advantageous in bridge circuit. Furthermore, the overvoltage on the transistor can be limited and thus usual safety margins can be reduced. A circuit of this type is particularly advantageous in high-voltage circuits where the transistors operate with their base reversely biased (operation so-called "in V C E X"). Thus, operating range of some transistors can be extended to 380 V voltage rectified networks.

Figure 2:
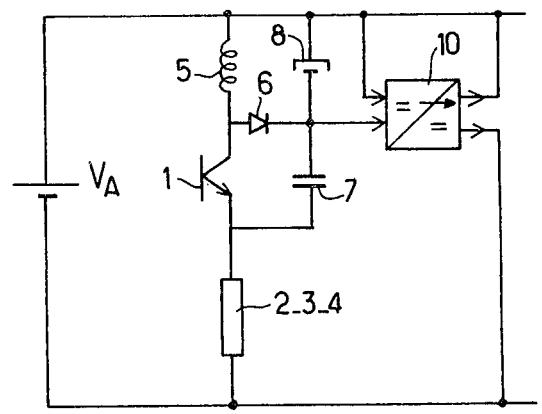
Figure 3:
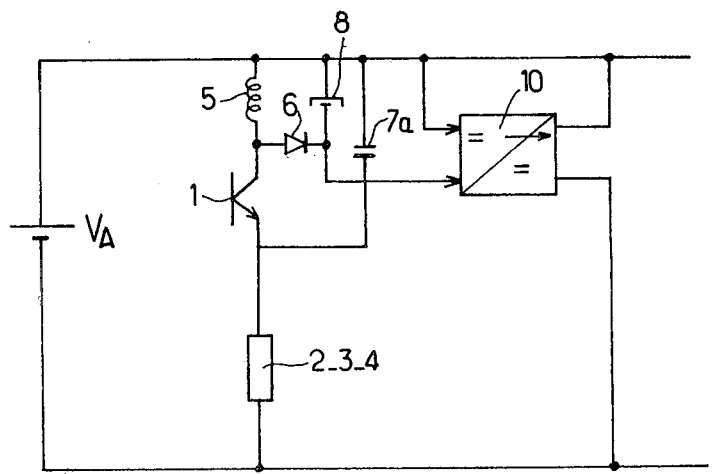
FIG. 3 shows another embodiment of a switching aid and energy recovery device.

In FIG. 3 is shown a modified embodiment of the circuit of FIG. 2, wherein switching aid capacitor 7a is connected between the collector of transistor 1 and the source-connected terminal of storage capacitor 8. The circuit of FIG. 3 is an improvement over the circuit of FIG. 2 whereby the current flowing through the storage capacitor 8 can be decreased.

Figure 4:
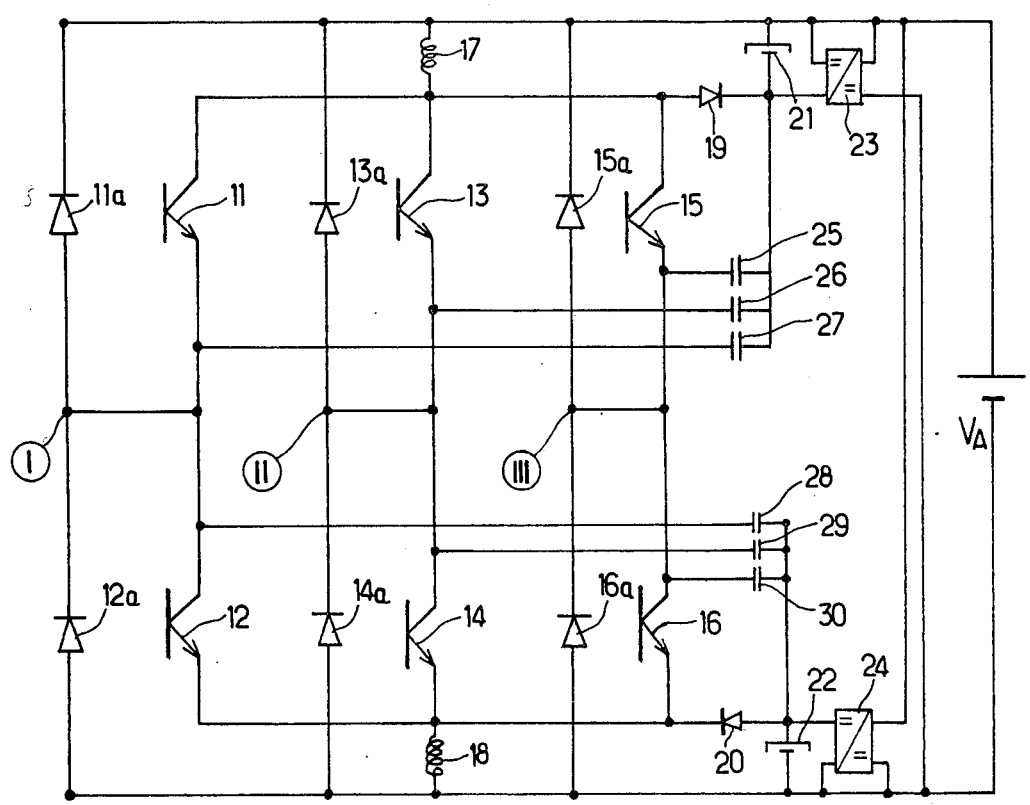
FIG. 4 shows a transistor polyphase converter making use of the device according the the invention.

In FIG. 4 is shown the use of such a circuit in a arrangement including several bridge-connected transistors 11 to 16 forming a polyphase converter for feeding an asynchronous motor. Reference numerals 11a to 16a designate the recovery diodes associated with the transistors.

The switching aid circuit includes a single inductor (17, 18 respectively), a single diode (19, 20 respectively), a single storage capacitor (21, 22 respectively) and a single recovery circuit (23, 24 respectively) for each group of three transistors, whereas there is the same number of switching aid capacitors (reference numerals 25 to 30) and of transistors. Since the circuit of FIG. 4 is of an iterative form, the number of transistors is not limited and may be increased for enabling the circuit to be used in feeding a stepper motor by increasing the number of branches of the diode and transistor bridges. Additionnally, the interleave resulting from transistor operation is such that the current flowing through the inductors can be substantially continuous. The only energy to be recovered is the energy from the switching aid capacitors and from the current variation through the load, and thus the energy recovery system can be undersized.

Figure 5:
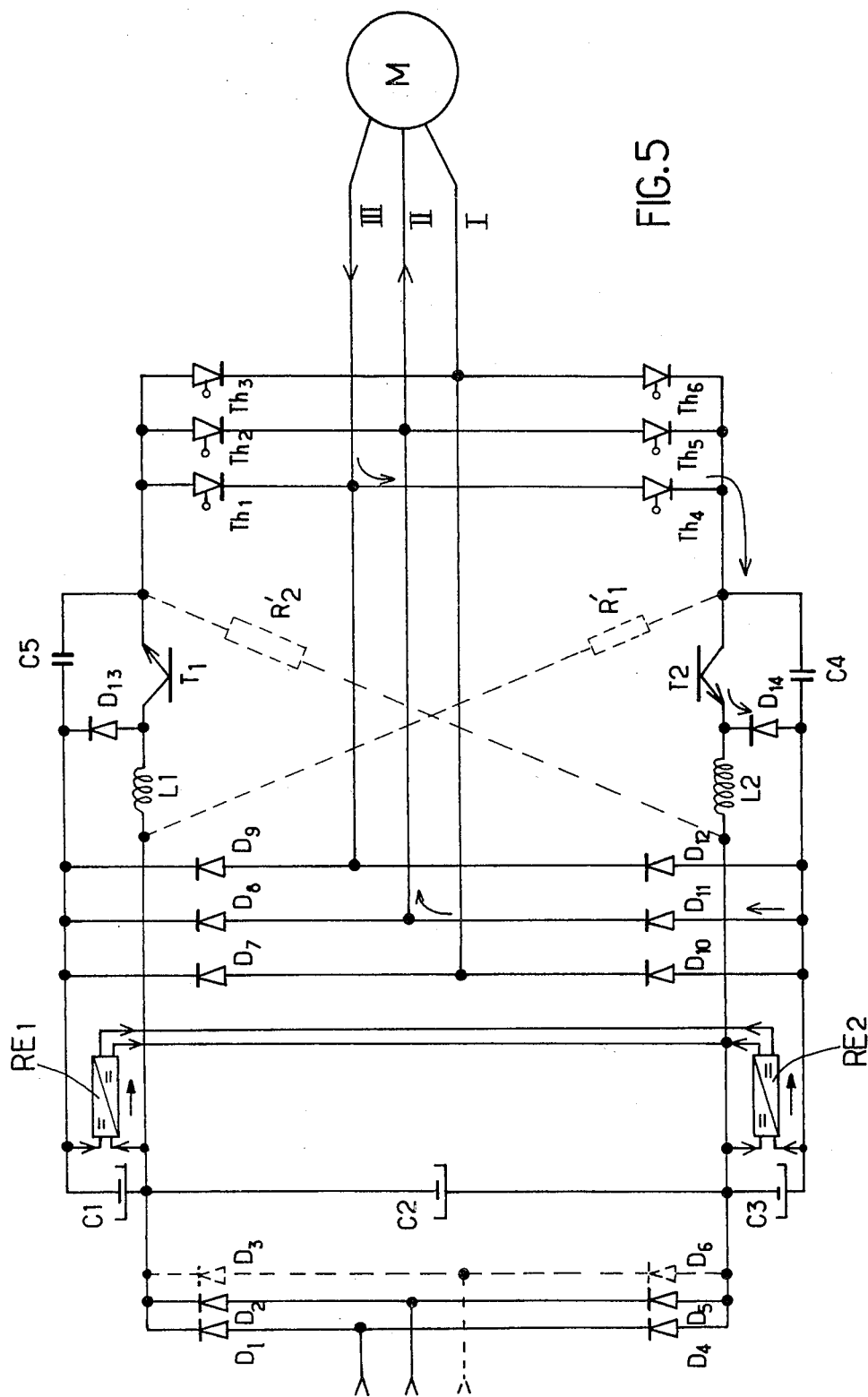
FIG. 5 shows a thyristor variable A.C. voltage generator making use of the device according to the invention.

The circuit as shown in FIG. 5 is a bridge circuit of thyristors ($Th_1$ through $Th_6$).

Such a circuit may be used for feeding either an asynchronous motor M or a variable speed synchronous motor and includes a bridge of rectifying diodes $D_1$ to $D_6$ upstream the switching aid circuits, transistors $T_1$ and $T_2$ and recovery diodes $D_7$ through $D_{12}$.

Said switching aid circuits each comprise an inductor ($L_1$, respectively $L_2$) series-connected with the respective transistor, and series-connected diode ($D_{13}$, respectively $D_{16}$) and switching aid capacitor ($C_5$, respectively $C_4$) which are parallel-connected with the respective transistor. Between the common terminal of diodes $D_1$, $D_2$, $D_3$ (or $D_4$, $D_5$, $D_6$, respectively) and the connecting point of the diode and switching aid capacitor is connected a storage capacitor ($C_1$, respectively $C_3$) across which is connected an energy recovery circuit such as the above-described circuit ($RE_1$, respectively $RE_2$). These recovery circuits feed the energy of capacitors $C_1$ and $C_3$ back to a storage capacitor $C_2$. Resistors $R_1'$ and $R_2'$ shown in broken lines serve to dissipate leakage currents from transistors $T_1$ and $T_2$.

In order to explain the device operation, it will be considered an arrangement wherein transistor $T_2$ is conducting current and the current flows through $T_2$, a thyristor of the lower group (e.g $Th_4$), a motor phase (e.g II–III) and a diode (e.g $D_{11}$). A firing control of transistor $T_1$ series-connected with thyristor $Th_2$ to effect switching has the following results: as $D_2$ does not immediately become blocked, there is generated both a current of recovery of the charges stored in the junction of said diode $D_{11}$ the said current flowing through $L_1$, $T_1$, $Th_2$ and $D_{11}$, and a current of discharge of capacitor $C_5$ which is added to the above recovery current through $T_1$ and $L_1$. However, such a process is of very short duration and does not result in substantial losses through the transistor.

Once the switching process is completed, the current flowing through $L_1$ cannot be abruptly cut off and must be closed. The current flowing through $L_1$ closes itself upon completion of the switching process through $D_{13}$ and $C_1$ (a path having a lower impedance than the path through $T_1$, $Th_2$, $D_8$ and $C_1$). The drawback of lengthening the period of existence of the overvoltage resulting from the switching process is thus overcome.

So that the circuit of FIG. 5 works under good conditions, capacitances of $C_1$ and $C_3$ must be selected much higher than $C_2$ so as to limit charging of $C_1$ and $C_3$ by the current flowing from the motor through diodes $D_7$ and $D_{12}$.

Another embodiment of the circuit applications may be provided by substituting the circuit as shown in FIG. 3 for the circuit of FIG. 2 in the circuit arrangements of FIGS. 4 and 5.

It should be understood that various other applications of the above device can be devised by men skilled in the art without departing from the scope of the invention.

We claim:

1. A DC/AC inverter device comprising:
   a supply source having first and second DC supply terminals;
   a plurality of paired thyristors mounted in a thyristor bridge having first and second pole terminals, each pair of thyristors having a junction point;
   a load having phases input terminals, each connected to a junction point of one respective pair of thyristors;
   a plurality of paired recovery diodes mounted in a recovery diode bridge having first and second pole terminals, each pair of recovery diodes having a junction point connected to a junction point of a corresponding pair of thyristors;
   first connecting circuit means having an input terminal connected to the first DC supply terminal, and an output terminal connected to the first pole terminal of the thyristor bridge, said first connecting circuit means comprising in series a first inductor and a first transistor, and a junction terminal between said first inductor and said first transistor;
   first parallel circuit means comprising a first diode having a first electrode connected to the junction point of said first inductor and said first transistor and a second electrode, and a first storage capacitor having a first electrode connected to the first DC supply terminal and a second electrode connected to the second electrode of said first diode and to the first terminal pole of the recovery diode bridge;
   first low voltage-high voltage converter circuit means having two input terminals respectively connected to the first and second electrodes of the first storage capacitor and two output terminals respectively connected to the first and the second DC supply terminals;
   a first switching aid capacitor having a first electrode connected to the first terminal pole of the thyristor bridge and a second electrode connected to the second electrode of the said first diode;
   second connecting circuit means having an input terminal connected to the second DC supply terminal, and an output terminal connected to the second pole terminal of the thyristor bridge, said second connecting circuit means comprising in series a second inductor and a second transistor, and a junction terminal between said second inductor and said second transistor;
   second parallel circuit means comprising a second diode having a first electrode connected to the junction point of said second inductor and said second transistor, and a second electrode, and a second storage capacitor having a first electrode connected to the second DC supply terminal and a second electrode connected to the second electrode of said second diode and to the second terminal pole of the recovery diode bridge;
   second low voltage-high voltage converter circuit means having two input terminals respectively connected to the first and second electrodes of the second storage capacitor and two output terminals respectively connected to the first and second DC supply terminals;
   a second switching aid capacitor having a first electrode connected to the second terminal pole of the thyristor bridge and a second electrode connected to the second electrode of the said second diode.

2. A DC/AC inverter device according to claim 1, in which said second electrode of said first switching aid capacitor is connected to the junction point of said first storage capacitor and said first inductor and in which said second electrode of said second switching aid capacitor is connected to the junction point of said second storage capacitor and said second inductor.

3. A DC/AC inverter device comprising:
   a supply source having first and second DC supply terminals;
   a plurality of paired transistors mounted in a transistor bridge having first and second pole terminals, each pair of transistors having a junction point;
   a load having phase input terminals, each connected to a junction point of one respective pair of transistors;
   a plurality of paired recovery diodes mounted in a diodes bridge having first and second pole terminals, each pair of recovery diodes having a junction point connected to a junction point of a corresponding pair of transistors;
   a first inductor mounted between said first pole terminal of the transistor bridge and said first pole terminal of the diodes bridge;
   first connecting circuit means having an input terminal connected to the first terminal pole of the transistor bridge and an output terminal connected to the first DC supply terminal, said first connecting circuit means comprising in series a first diode having a first electrode connected to the first terminal pole of the thyristor bridge, and a second electrode, and a first storage capacitor having a first electrode connected to the first DC supply terminal and a second electrode connected to the second electrode of the said first diode;
   a first plurality of switching aid capacitors, each comprising a first electrode connected to the second electrode of the first diode and a second capacitor connected to the junction point of a corresponding pair of transistors of the transistor bridge;
   first low voltage-high voltage means having two input terminals respectively connected to the first and second capacitor electrodes of the first storage capacitor and two output terminals respectively connected to the first and second DC supply terminals;
   a second inductor mounted between said second pole terminal of the thyristor bridge and said second pole terminal of the diodes bridge;
   a second conducting circuit means having an input terminal connected to the second terminal pole of the transistor bridge and an output terminal connected to the second DC supply terminal, said second connecting circuit comprising in series a second diode having a first diode electrode connected to the second terminal pole of the thyristor bridge and a second diode electrode, and a second storage capacitor having a first capacitor electrode connected to the second DC supply terminal and a second capacitor electrode connected to the second diode electrode of the said second diode;

a second plurality of switching aid capacitors, each comprising a first capacitor electrode connected to the second diode electrode of the second diode and a second capacitor electrode connected to the junction point of a corresponding pair of transistors of the transistor bridges;

a second low voltage-high voltage having two input terminals respectively connected to the first and second capacitor electrodes of the second storage capacitor and two output terminals respectively connected to the first and the second DC supply terminals.

4. A DC/AC inverter device according to claim 3, in which the first capacitor electrodes of the first plurality of switching aid capacitors are connected to the first pole terminal of the diode bridge and in which the first capacitor electrodes of the second plurality of switching aid capacitors are connected to the second pole terminal of the diode bridge.

* * * * *